United States Patent
Alvarellos Iglesias et al.

(10) Patent No.: US 11,414,988 B2
(45) Date of Patent: Aug. 16, 2022

(54) METHOD OF ESTIMATING THE REGION OF DAMAGE DUE TO COLLAPSE IN THE WALL OF A BOREHOLE DURING THE DRILLING OPERATION

(71) Applicant: Repsol, S.A., Madrid (ES)

(72) Inventors: Jose Alvarellos Iglesias, Madrid (ES); José María Segura Serra, Madrid (ES); Marta Dueñas Díez, Madrid (ES); Enric Ibañez Martinez, Madrid (ES); Lakshmikantha Mookanahallipatna Ramasesha, Madrid (ES); Almudena Díaz Aguado, Madrid (ES)

(73) Assignee: REPSOL, S.A., Madrid (ES)

( * ) Notice: Subject to any disclaimer, the term of this patent is extended or adjusted under 35 U.S.C. 154(b) by 492 days.

(21) Appl. No.: 16/500,312

(22) PCT Filed: Apr. 3, 2018

(86) PCT No.: PCT/EP2018/058482
§ 371 (c)(1),
(2) Date: Oct. 2, 2019

(87) PCT Pub. No.: WO2018/185095
PCT Pub. Date: Oct. 11, 2018

(65) Prior Publication Data
US 2020/0149393 A1    May 14, 2020

(30) Foreign Application Priority Data
Apr. 3, 2017  (EP) .................................. 17382171

(51) Int. Cl.
*E21B 49/00* (2006.01)
*E21B 47/022* (2012.01)
(Continued)

(52) U.S. Cl.
CPC .......... *E21B 49/003* (2013.01); *E21B 47/022* (2013.01); *E21B 47/026* (2013.01);
(Continued)

(58) Field of Classification Search
CPC .... E21B 49/006; E21B 2200/20; E21B 47/08; E21B 41/00; E21B 49/003; E21B 47/022;
(Continued)

(56) References Cited

U.S. PATENT DOCUMENTS

2013/0275099 A1* 10/2013 Frydman ................. G06F 30/20
                                                            703/2
2015/0055438 A1   2/2015 Yan et al.

FOREIGN PATENT DOCUMENTS

WO    WO2013112114 A1    8/2013

OTHER PUBLICATIONS

Li, "Optimization of wellbore trajectory using the initial collapse volume", Dec. 29, 2015, Journal of Natural Gas Science and Engineering (Year: 2015).*

(Continued)

*Primary Examiner* — Rehana Perveen
*Assistant Examiner* — Troy A Maust
(74) *Attorney, Agent, or Firm* — Reising Ethington P.C.

(57) ABSTRACT

The present invention relates to a method of estimating the region of damage due to collapse in the wall of a well during the drilling operation, normally using drilling fluid, where said well can, for example, be intended either for the injection or else for the production of a gas or oil reservoir. Other uses can be found in mining and in civil engineering work. This method is characterized by a set of analytical steps that allow establishing, for example, optimal drilling parameters so as to allow the fastest possible drilling speed that is also safe enough to allow is charging the collapse material without jamming the drilling tool. This method (Continued)

likewise allows assessing both the width and depth of damage in the wall of the well.

5 Claims, 5 Drawing Sheets

(51) Int. Cl.
  *E21B 47/026* (2006.01)
  *E21B 49/06* (2006.01)
  *E21B 49/08* (2006.01)
  *E21B 47/008* (2012.01)
(52) U.S. Cl.
  CPC ............ *E21B 49/06* (2013.01); *E21B 49/088* (2013.01); *E21B 47/008* (2020.05)
(58) Field of Classification Search
  CPC ...... E21B 47/026; E21B 49/06; E21B 49/088; E21B 47/008; E21B 21/00; E21B 49/00; E21B 33/00; E21B 21/001; E21B 21/002; E21B 21/003; E21B 21/01; E21B 21/012; E21B 21/015; E21B 21/019; E21B 21/02; E21B 21/06; E21B 21/062; E21B 21/063; E21B 21/065; E21B 21/066; E21B 21/067; E21B 21/068; E21B 21/07; E21B 21/08; E21B 21/082; E21B 21/085; E21B 21/10; E21B 21/103; E21B 21/106; E21B 21/12; E21B 21/14; E21B 21/16; E21B 21/18; G06F 30/20; G06F 2111/10; G01V 99/005

See application file for complete search history.

(56) References Cited

OTHER PUBLICATIONS

Mostafavi V et al., "Model-Based Uncertainty Assessment of Wellbore Stability Analyses and Oownhole Pressure Estimations", Jun. 26, 2011, XP055405647 (11 pages).

Segura J et al., "Estimating drilling conditions based on forward modeling along wells, a case study including mechanical and chemical compaction", Jun. 26, 2016, XP055481257 (8 pages).

Segura J et al., "Fault-stability-assessment-for-well-planning-a-casestudy-related-to-salt-structures" Jan. 1, 2016, XP055405285 (7 pages).

International Search Report for International Application No. PCT/EP2018/058482 dated Jun. 21, 2018 (4 pages).

* cited by examiner

METHOD OF ESTIMATING THE REGION OF DAMAGE DUE TO COLLAPSE IN THE WALL OF A BOREHOLE DURING THE DRILLING OPERATION

RELATED APPLICATION

This application is the National Stage of International Patent Application No. PCT/EP2018/058482, filed on Apr. 3, 2018.

OBJECT OF THE INVENTION

The present invention relates to a method of estimating the region of damage due to collapse in the wall of a hole during the drilling operation, normally using drilling fluid, where said hole can, for example, be intended either for the injection or else for the production of a gas or oil reservoir. Other uses can be found in mining and in civil engineering work.

This method is characterized by a set of analytical steps that allow establishing, for example, optimal drilling parameters so as to allow the fastest possible drilling speed that is also safe enough to allow discharging the collapse material without jamming the drilling tool.

This method likewise allows assessing both the width and depth of damage in the wall of the hole-well.

BACKGROUND OF THE INVENTION

Well-drilling for operating gas or oil reservoirs is a very costly project economic wise and the operating conditions for boring depend on many variables with respect to which there is not always enough data, giving rise to very high values of uncertainty.

This uncertainty is much greater in reservoirs in which boring is performed for the first time where there is usually no data or physical sample that allows increasing knowledge about the geology in the area.

Well-drilling generates an empty tubular space obtained after removing rock that occupied that space. Taking the stress state before drilling and the in situ stress as a reference, drilling operations modify the stress state based primarily on two reasons: rock removal eliminates the structural element compensating for the stress state of the free surface of the generated well; and during drilling, the drilling fluid forms a column that exerts pressure on the wall of the well depending primarily on the height to the surface and on the density of said drilling fluid, without taking into account dynamic effects.

In fact, one of the parameters to be modified which are used in the drilling operation is the change in density of the drilling fluid in order to change the pressure that is exerted on the wall of the well.

There are other causes generating stresses such as the bit in charge of drilling the rock, but they are understood as being required for breaking up and removing rock in the space generated in the well.

When the drilling operation uses a drilling fluid, said drilling fluid is usually injected through an inner conduit of the drilling tool. The drilling tool breaks up the rock at the bottom of the wellbore generating material having a diverse grain-size distribution that must be removed. The drilling fluid flow injected at the end of the drilling tool entrains this material obtained by drilling rock, flowing upward primarily through the annular space demarcated between the drilling tool and the already generated wall of the well, until reaching the surface where this material is discharged.

The drilling fluid rising up through the annular space exerts pressure against the generated wall of the well. The pressure depends on the weight of the drilling fluid column existing up to the upper surface and also on the speed of the upward flow. The weight of the column is therefore a first estimation of the pressure exerted on the free surface of the wall of the well. A second estimation takes into account the dynamic stresses of the drilling fluid column according to flow conditions.

This pressure may be excessive, exceeding the maximum allowable stress allowed by the rock generating fractures, for example. Likewise, this pressure may be insufficient and may not compensate for the resistance forces of the removed material to give rise to the well. In this case, the stresses of the rock can exceed the allowable or breaking stress of the rock, causing the material of the wall to break and collapse into the well where drilling is being performed.

If this collapse occurs during drilling, the drilling fluid must be capable of discharging the material generated by the drilling tool plus the collapse material. The amount of the collapse material primarily depends on the volume of rock material that has sustained damage.

Collapse occurs in almost all wellbores. When establishing the design of the drilling conditions, it is important to quantify the collapse in order to assess whether there are drilling parameters that render drilling feasible even if this collapse occurs.

After having established well viability, knowing the optimal drilling parameters under conditions with collapse is also of interest.

State-of-the-art analytical modes for assessing damage in wellbores almost exclusively consider the value of the angle measuring the width of damage in the wall of the well. These analytical techniques use the stress state established by the structure of the rocks forming the reservoir taking into account in situ stresses. These analytical techniques use Kirsch equations, which allow describing the stress state around a well on an infinite plane. There are also analytical and numerical techniques which allow estimating in situ stresses.

The analytical techniques known up until now consider, by hypothesis, that the medium is isotropic and linear, and perform all calculations using the original cylindrical geometry resulting in an incorrect calculation of the stress around the well and therefore do not allow calculating the depth of damage.

Criteria based solely on the angle covered by the damage in the wall of the well have been developed with techniques of this type. There is a maximum angle referred to as angle of collapse, the value of which is established by each of the companies dedicated to drilling. With this criterion, it is possible to establish under which conditions there is considered to be excessive damage: when at a given depth, the angle of damage is found to be greater than the angle of collapse. In this case, it is established that the damage in the wall of the well prevents discharging the collapsed material during the drilling operation, the wellbore being determined to be unviable.

It has been experimentally proven that variation in collapse angle with respect to the weight of the drilling fluid is approximately linear; nevertheless, the area of damage measured according to a transverse section, and therefore proportional to the collapse volume, increases exponentially with respect to weight of the fluid. In other words, minor variations in the weight of the drilling fluid gives rise to minor variations in the angle of damage (used as parameter in the state of the art), and it generates, however, major variations in the volume of failed rock. The result is an inadequate estimation of the collapse volume.

While attempting to reduce the angle of damage, the pressure calculated for the drilling fluid may also exceed the pressure established as the upper limit, i.e., the pressure above which a crack is generated.

This criterion based on the angle of damage in the wall of the well does not take into account the depth of the damage. It has been experimentally found that the described criteria applied according to the state of the art rule out certain drillings since they consider that there would be collapse which would not allow drilling parameters that would make such wellbore viable, when in practice such wellbores would indeed be viable. This is the case of collapse with a large angle of damage but not very deep, generating a reduced collapse volume.

When this occurs, i.e., when it is concluded that a given well is not viable when it actually is, the alternative is to search for another well location. Since the first location is usually determined by optimization techniques, the change of well location reduces the optimal character of the initial operating plan, or the change may even require drilling two or more wells in place of the former, significantly increasing costs and reducing production capacity.

The present invention allows estimating the region of damage, particularly the width and depth of damage, providing as one of the first applications the use of optimal parameters while drilling.

The method of estimating the region of damage according to the invention not only allows calculating with greater precision optimal drilling parameters taking into account the collapse material, but also in those cases where the angle of damage is small but the depth of damage is very large, giving rise to significant collapse volumes, the method may consider well-boring to be unviable when, by applying techniques based on the state of the art, it would have been accepted, leading to attempts to perform drilling that end in failure.

In wells where the criteria according to the state of the art establish drilling viability, the parameters obtained according to the invention also allow establishing the most favorable drilling conditions, maintaining safety levels that are even higher than those determined in the state of the art.

The determination of the region of damage according to the invention allows assessing such a region before drilling is performed.

DESCRIPTION OF THE INVENTION

The present invention solves the problems identified in the preceding section, providing a method of estimating the region of damage due to collapse in the wall of a well prior to the drilling operation for obtaining a well. One of the most important applications is obtaining wells for the injection or production of a gas or oil reservoir, where said drilling may occur with the use of drilling fluid.

The method comprises the following steps:
a) generating a geomechanical model of a domain comprising a path of the well to be drilled at least incorporating rock data and mechanical properties of the given rock for a pre-specified in situ stress field;
b) generating a fluid flow model of the same domain at least incorporating drilling fluid data, where said fluid flow model models the rock as a porous medium and comprises the pore pressure in said porous medium;

The domain is a pre-specified region comprising the path of the well to be drilled. Taking gas or oil reservoirs as an example, these reservoirs are formed primarily by porous rocks that store gas or oil trapped in the pores. The domain can contain the reservoir and be more extensive to the point of including the portion of rock reaching the surface of the earth. It can also be smaller than the reservoir, containing only a part of said reservoir, although it must indeed house the path to be drilled. In applications of another type, the fluid can be water, for example. The mechanical behavior of the rock depends both on the mechanical properties of the rock and on the influence of the fluid trapped in the pores of the rock due to the pressure at which said fluid is found. Particularly, at least the mechanical properties of the rock, the properties of the fluid trapped in the rock and also the drilling fluid which is in contact with the generated surface of the well are relevant.

In one embodiment, steps a) and b) are performed by means of a computational system.

In order to establish the stress state of the well, it is necessary to generate a geomechanical model of the reservoir incorporating these properties as well as the in situ stress field and the conditions of the surrounding area or the conditions of the surrounding area and the initial conditions if the model is based on an initial value problem also taking dynamic variables into account.

The geomechanical and fluid flow models allow reproducing the behavior of the rock in the drilling conditions for determining the stresses causing damage under the simplifying hypotheses of the models used.

Additionally, the method also comprises:
c) establishing the vertical height z at which the circular section S of the well in which the region of damage due to collapse in the wall of said well is to be estimated is located, section S being transverse to the borehole path of the well, and establishing the orientation of the normal of said section S;
d) determining the pressure of the drilling fluid, should there be any, the pore pressure $p_p$, maximum stress $\sigma_{max}$, minimum stress $\sigma_{min}$ and the mechanical properties of the rock in section S based on the geomechanical model;
e) determining the stress state $\sigma(\theta)$ of the rock on the periphery of section S of the borehole at least according to the data from the preceding step where:
  i. $\sigma$ is the scalar value of the equivalent stress,
  ii. $\theta$ is the angle with respect to a system of axes located in section S of the borehole, centered in the center of said section S and with an orientation on the plane containing section S, such that $\sigma(\theta=0)=\sigma_{min}$ and $\sigma(\theta=\pi/2)=\sigma_{max}$;
f) determining the collapse angle $\theta_{br}$ as the angle centered in $\theta=\pi/2$ and covering the arc of the periphery of section S where the stress $\sigma(\theta)$ is greater than an allowable stress of the rock.

The method allows assessing the region of damage at a given vertical height z. For example, applying the method multiple times allows assessing the region of damage at given heights of the well and therefore along the longitudinal direction of the well.

At the pre-established height z, a circular section S of the well is considered. The path of the well does not have to be vertical; it is generally defined by a curve on which it is possible to define the tangent. The circular section S is the result of the intersection of a plane of section oriented transverse to the well, i.e., perpendicular to the tangent to the path of the well. The method assesses which region sustains damage in the portion of the plane corresponding to the rock.

The method does not require the calculation of the stress state in internal regions of the plane corresponding to internal regions of the rock; it is enough to simply determine the stress state at the point of the path of the well where section S is located.

The calculation can be done by means of known techniques, for example by means of the Kirsch equations based on pore pressure $p_p$, maximum stress $\sigma_{max}$, minimum stress $\sigma_{min}$ and the mechanical properties of the rock in section S.

The stress state of the rock along the circular path established by section S of the drilling is defined by $\sigma(\theta)$, $\theta$ being the angle running along the circumference. The equivalent stress $\sigma$ is a scalar which takes the value of the equivalent stress, equivalent stress being understood as the value of one-dimensional stress equivalent to a stress state determined by the three main stresses. A particular case of equivalent stress is von Mises stress.

Although the stress state is independent of the reference system chosen in the embodiments, for the sake of clarity, the origin of the angle $\theta=0$ is considered to be a point of the circumference where $\sigma(\theta=0)=\sigma_{min}$ and the angle increase such that $\sigma(\theta=\pi/2)=\sigma_{max}$. This angle is taken from the rotation about the axis established by the tangent to the path of the well.

Performing the same method with a change in reference with respect to the reference thus chosen but using the same functional correspondence is considered equivalent.

Once the stress $\sigma(\theta)$ on the periphery of the circumference has been determined, the collapse angle $\theta_{br}$ is established as the angle covering the arc of circumference of section S where $\sigma(\theta) > \sigma_{adm}$ is verified, $\sigma_{adm}$ being the value of maximum allowable stress of the rock, i.e., the arc where the stress exceeds the maximum stress of the rock and gives rise to the failure of the material.

The depth of damage has not been determined in this calculation.

Based on the function $\sigma(\theta)$, the method according to the invention performs the following steps:

g) defining the family of ellipses of eccentricity e, contained on the plane of section S, wherein eccentricity e is defined as the ratio of the semi-minor side to the semi-major side of the ellipse, such that:
  iii. an ellipse corresponding to the value of eccentricity e=1 is the circumference established by the circular section S of the well; and
  iv. the intersection between another ellipse and said circular section S of the well is established at points $\pi/2+\theta_{br}/2$ and $\pi/2-\theta_{br}/2$ as well as at their symmetrical points $-\pi/2+\theta_{br}/2$ and $-\pi/2-\theta_{br}/2$, respectively;

The family of ellipses is parameterized based on a single parameter, eccentricity e; i.e., the ratio of its semi-minor side a to its semi-major side b; e=a/b. When the eccentricity takes the value of one, the circumference corresponding to the circular section S of the well is recovered. If the eccentricity e increases, the ellipse cuts off the circumference at two points on each major side of the ellipse, hence the identified four cut-off points. The damage will be assessed on one of the sides of the ellipse, i.e., the side corresponding to the position of the collapse angle $\theta_{br}$, given that said collapse angle $\theta_{br}$ corresponds to an arc centered at the end of the major side of the ellipse. This is the orientation adopted by the ellipse around the circumference of the circular section S of the well.

In other words, given the collapse angle $\theta_{br}$ establishing the width of damage on the wall of the well, this angle is the same for all ellipses of the defined family of ellipses, and therefore the parameterized family of ellipses always passes by the ends of the collapse angle $\theta_{br}$.

The steps for calculating the region of damage are the following:

h) defining a factor of safety $$F = \Sigma\sigma_{ext}/\Sigma\sigma_{res}$$

where $\Sigma\sigma_{ext}$ is the sum of external forces on the rock at a given point of the rock, depending at least on the in situ stresses, on the density ($\gamma$) of the drilling fluid should there be any, on the elastic properties of the rock and on the pore pressure $p_p$; and
where $\Sigma\sigma_{res}$ is the sum of resistance forces of the rock at same points, depending on a stress tensor, on the strength properties of the rock and on an angle of internal friction of the rock;

i) determining a function $F(\theta,e)$ as the factor of safety F evaluated at a point of the ellipse defined by the eccentricity e for a value of the angle $\theta$.

The method of calculation establishes by hypothesis that there is a region of hypothetical damage having a border with the region where there is no damage according to an elliptical curve. The family of ellipses determined by parameter e, eccentricity, as defined in step g), is defined in particular. Likewise, by hypothesis, although the supposed area of damage does exist in the preceding hypothesis, contrary to what a person skilled in the art would consider, the stress at this elliptical border will be considered to be determined by elastic solution taking the pressure of the drilling fluid, should there be any, as one of the acting external forces.

It has already been indicated that for the value of eccentricity e=1, the circumference coincides with the wall generated by the drilling tool in section S. The radius of this circumference will be denoted as R. For any other value of eccentricity e, the parametric curve $r(\theta)$ according to the angle and running along the ellipse can be defined by the expression $$r(\theta) = \frac{R}{\sqrt{\cos^2\theta + e^2\sin^2\theta}}$$

where $\theta$ is the angle running along the interval $[0,2\pi)$, R is the radius of the circumference of the well in section S, and r is the distance from the center of the well to the point of the elliptical curve of eccentricity e established by the angle $\theta$.

The expression "can be defined" is used since there are infinite parametric curves running along the same ellipse; nevertheless, the method is independent of the mathematical expression used for representing the ellipse. Any way of representing the same ellipse is therefore considered equivalent to the method according to the invention.

Finally, according to the invention, the method establishes the region of damage according to the following steps:

j) establishing a cut-off threshold value $\theta_0 < \pi/2$;

k) determining the value of eccentricity $e_0$ closest to one verifying $F(\theta_0,e_0)=f_0$, where $f_0$ is a pre-established reference value close to one;

l) establishing the intersection region between the ellipse of eccentricity $e_0$ and the circumference of section S of the well as the region of damage, according to section S of the well and at vertical height z.

The factor of safety F is defined as the ratio of external forces or acting forces on the rock with respect to the resistance forces. If external forces exceed resistance forces, then there is damage in the rock. When resistance forces are equivalent to resistance forces, the factor of safety takes the value of one. Nevertheless, instead of the value 1, it is possible to adopt a pre-established safety value $f_0$ other than one and it is established by the person skilled in the art according to each particular case.

In practice, the value of eccentricity increases gradually from minimum eccentricity, until finding a value of eccentricity $e_0$ for which F reaches the value $f_0$. F is not assessed at $\pi/2$ since in all cases the function F was found to increase asymptotically to infinity when the angle $\theta$ approaches $\pi/2$.

With this asymptotic behavior of F, a person skilled in the art would be discouraged from using the factor of safety F function for establishing the value of eccentricity or considering that damage is limited by an elliptical curve. Surprisingly, though, it has been experimentally proven that by establishing a cut-off value $\theta_0 < \pi/2$ for assessing $F(\theta, e)$ and establishing the eccentricity $e_0$ making said function not exceed the value $f_0$, the method allows suitably identifying the ellipse corresponding to the region of damage observed in the experimental results.

Once the eccentricity $e_0$ complying with the preceding criterion has been determined, the method establishes the region located between the ellipse of eccentricity $e_0$ and the circumference as the region of damage.

With this region of damage, the collapse volume per unit of length in section S located at height z is determined, for example. Applying the method along a plurality of discrete points of the vertical coordinate allows establishing: a) if it is possible to establish drilling parameters at all points of the wellbore drilling parameters making the wellbore viable; and b) if this drilling is viable, they allow determining the configuration and volumes of damage according to vertical height and therefore establishing optimal drilling parameters.

DESCRIPTION OF THE DRAWINGS

The foregoing and other features and advantages of the invention will be more clearly understood based on the following detailed description of a preferred embodiment, provided only by way of illustrative and non-limiting example in reference to the attached drawings.

DETAILED DESCRIPTION OF THE INVENTION

According to the first inventive aspect, the present invention relates to a method of estimating the region of damage due to collapse in the wall of a well during the drilling operation for the injection or production of a gas or oil reservoir.

Figure 1:
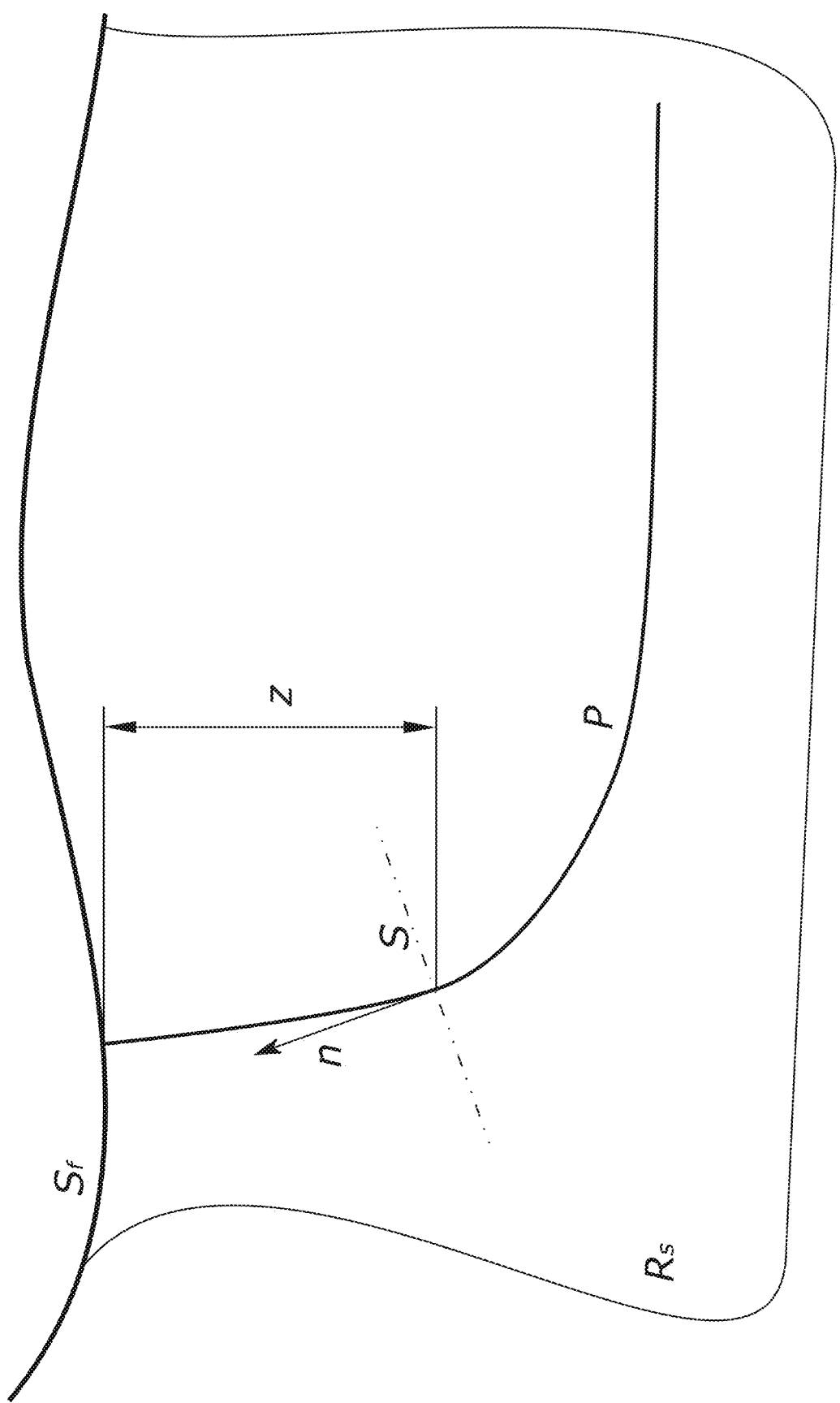
FIG. 1 shows a scheme for making a well in an oil reservoir, defined by a wellbore trajectory, where a section S on which the region of damage is to be determined is established at a given point of the path.

FIG. 1 schematically shows the section of a reservoir with oil reserves, where the upper line represents the surface of the reservoir and the volume of the reservoir identified by the lower line (Rs), a well (P) being demarcated therein.

The well (P) is a borehole having a circular section S extending along a path depicted by a curve. The curve is shown in FIG. 1 beginning at the surface, descending in an almost vertical path, and after increasing its inclination ending in an almost horizontal segment.

The region of damage in a section S located at a height z is to be calculated along this path. At this height z, the tangent n to the path coincides with the normal to the transverse plane of section where the region of damage is to be determined.

This same drawing depicts by means of a dashed line the plane transverse to the drilling path of the well at a pre-established point.

Figure 2:
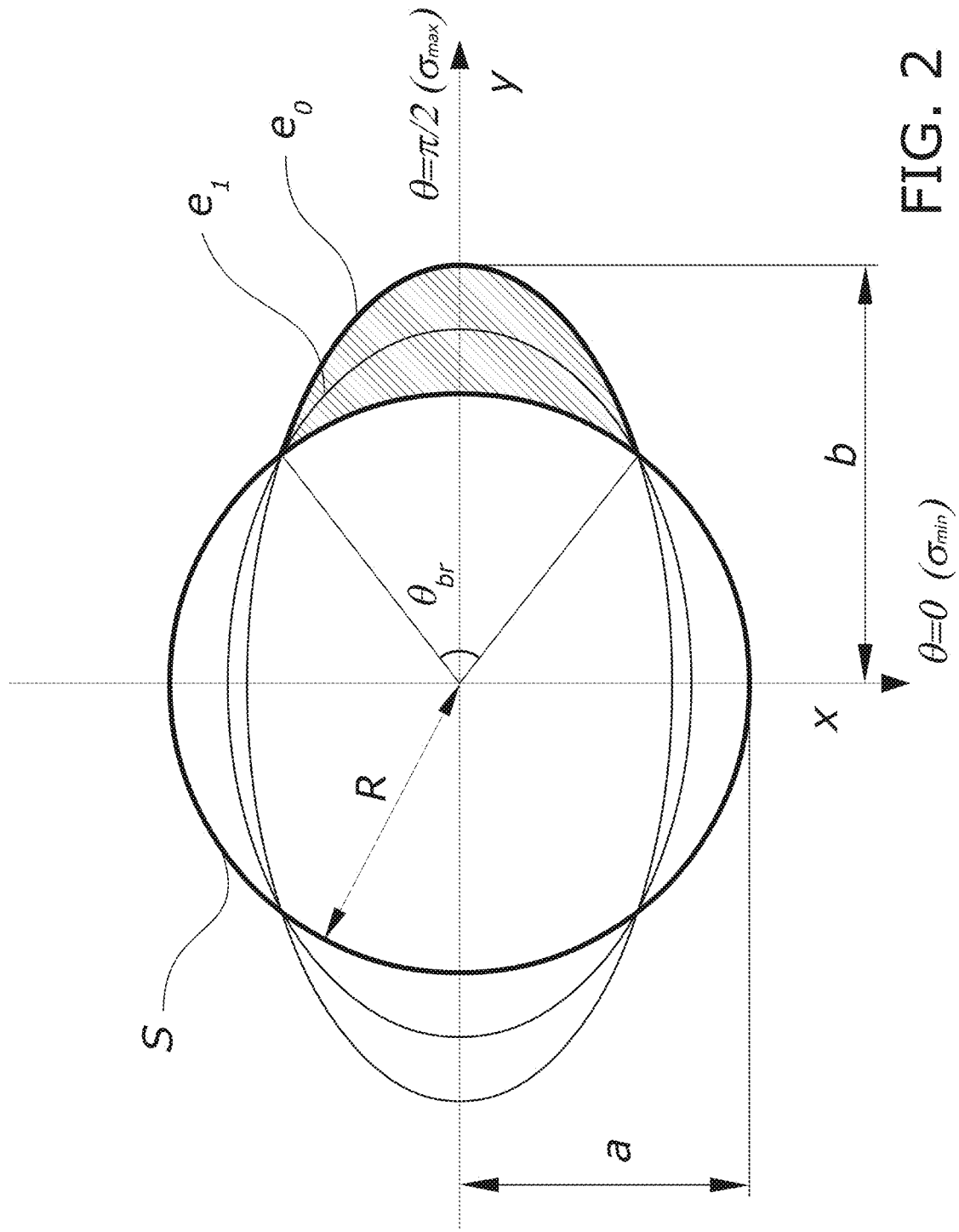
FIG. 2 shows a scheme for making a well in a sectional view, as well as a pair of ellipses with different eccentricity used in the calculation steps according to the invention.

FIG. 2 schematically shows a circumference in a thick line representing the theoretical wall of the borehole in the plane of section S.

In order to determine the region of damage, a geomechanical model of the reservoir at least incorporating the rock data and the mechanical properties of said rock is generated in a computational system and the in situ stress field is established. The geomechanical model establishes a relationship between the field of acting forces at a given point of the domain and the properties of the material.

For each case, the forces acting at a point must be determined, such forces including those caused by the fluids which are stored under pressure in porous rocks, or also the pressures due to the drilling fluid injected while drilling the well, should there be any fluid injected.

Additionally, a fluid flow model of the same reservoir which at least models the porous medium suitable for housing liquid is generated in this example in the computational system. If drilling fluid is used in the borehole, then the fluid flow model must likewise incorporate this fluid and the interaction with the walls of the well. The fluid flow model includes the pore pressure in the porous medium.

Given that deformations of the porous media give rise to changes in the fluid flow model, and the forces thereof influence the geomechanical model, both models must be coupled to one another.

It is possible to determine the pore pressure $p_p$, stress state and mechanical properties of the rock in section S through the geomechanical and fluid flow models. It is also possible in particular to determine the pressure of the borehole fluid should one be used.

Given the direction normal to the plane of section S, by means of rotation about said normal, it is established a direction where stress is minimum $\sigma_{min}$ and a direction which is perpendicular to the preceding direction, where stress is maximum $\sigma_{max}$. These directions are those used as the axes of reference for establishing the site where damage occurs and its extent.

After having established the axes, the stress state in the rock along the curve defined by the circumference corresponding to the wall of the drilling is determined based on the geomechanical model. The value of the equivalent stress is calculated based on the stress state determining the arc of a curve where said equivalent stress is greater than the allowable stress of the rock.

This arc is centered in $\pi/2$ due to the way of constructing the axes of reference and the width thereof is the collapse angle $\theta_{br}$.

FIG. 2 shows both axes which are axes that will correspond to the major and minor sides of a family of ellipses. This family of ellipses is parameterized by means of the eccentricity e. For a value of eccentricity equal to 1, the ellipse is the circumference having a radius R corresponding to the circumference representing the wall of the well according to section S. For increasing values of eccentricity e, ellipses having one end of the major side penetrating the rock while the minor side being smaller than the radius of the well R, are obtained. Of the ellipses thus obtained, the part of the ellipse which penetrates the rock and which will be the curve defining the region of damage will be of special interest.

The points where the collapse angle starts and ends are the points where the intersection between the circumference and any of the ellipses of the parameterized family in e is established.

The values of 2a and 2b in FIG. 2 identify the length and width of a given ellipse. Two ellipses of eccentricity $e_1$ and $e_0$ are also shown.

The factor of safety is used to determine the ellipse defining the region of damage $$F=\Sigma\sigma_{ext}/\Sigma\sigma_{res}$$

where $\Sigma\sigma_{ext}$ is the sum of external forces on the rock at a given point of the rock, depending at least on the in situ stresses, on the density of the drilling fluid ($\gamma$) should there be any, on the elastic properties of the rock and on the pore pressure $p_p$; and
where $\Sigma\sigma_{res}$ is the sum of resistance forces of the rock at the same point, depending on the stress tensor, on the strength properties of the rock and on the angle of internal friction of the rock.

This factor of safety depends on the angle and on the factor of eccentricity where the value of one identifies the equilibrium between the forces and the resistance capacity. Damage is deemed to exist when this equilibrium is broken. Nevertheless, it is possible for a person skilled in the art to select values $f_0$ other than but close to one as the factor of safety, for example. Valid $f_0$ values are those comprised in the [0.7, 1.3] range, and more preferably in the [0.8, 1.2] range, and more preferably in the [0.9, 1.1] range and more preferably in the [0.95, 1.05] range.

Figure 3:
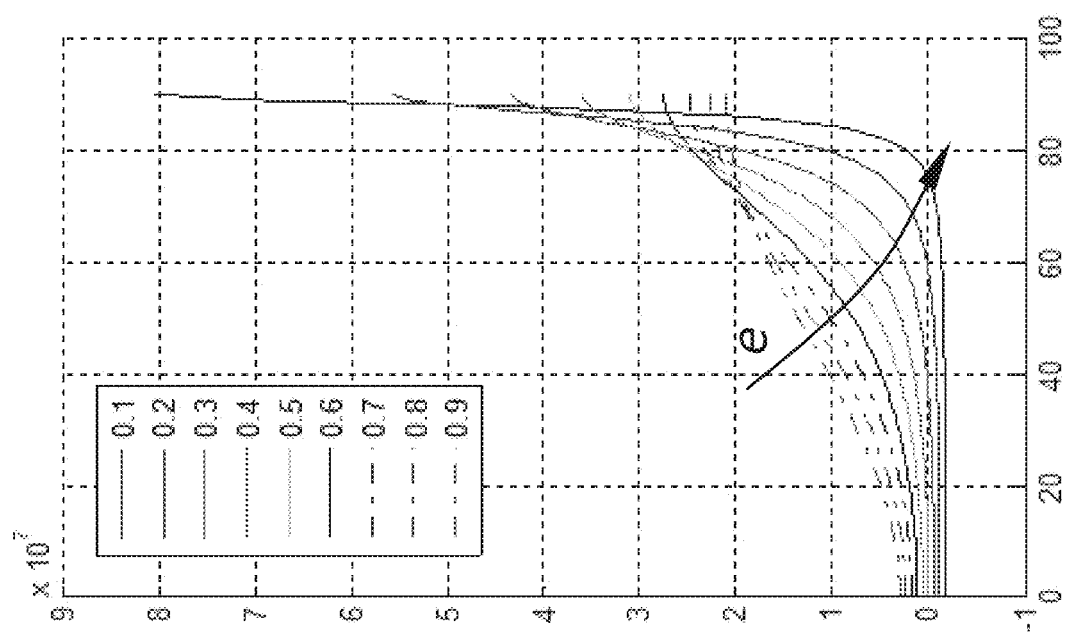
FIG. 3 shows a graph of stresses on the periphery of a family of ellipses. The family of ellipses is represented by means of a plurality of curves identified with an arrow in which the direction in which the eccentricity increases is shown. The x-axes show the angle in the section taking the point of minimum stress as a reference.

FIG. 3 shows a graph of stress according to the angle θ where for values close to $\pi/2$, identified in the drawing as close to 90 given that it is expressed in degrees instead of radians, the stress acquires asymptotically high values as eccentricity increases.

This fact renders useless the approach according to the state of the art for the estimation of damage since in no case would it consider that a safe situation exists.

With this hypothesis, the area of the end of the ellipse reaches unacceptable values in almost any case which would invalidate this method of determining the region of damage. Nevertheless, it has been found that if this bias is overcome by eliminating values above the pre-specified value $\theta_0<\pi/2$, then the method predicts with great precision the region of damage.

After having established $\theta_0<\pi/2$, the value of eccentricity $e_0$ closest to one is determined, verifying $F(\theta_0,e_0)=f_0$, where $f_0$ is the pre-established reference value close to one.

Figure 4:
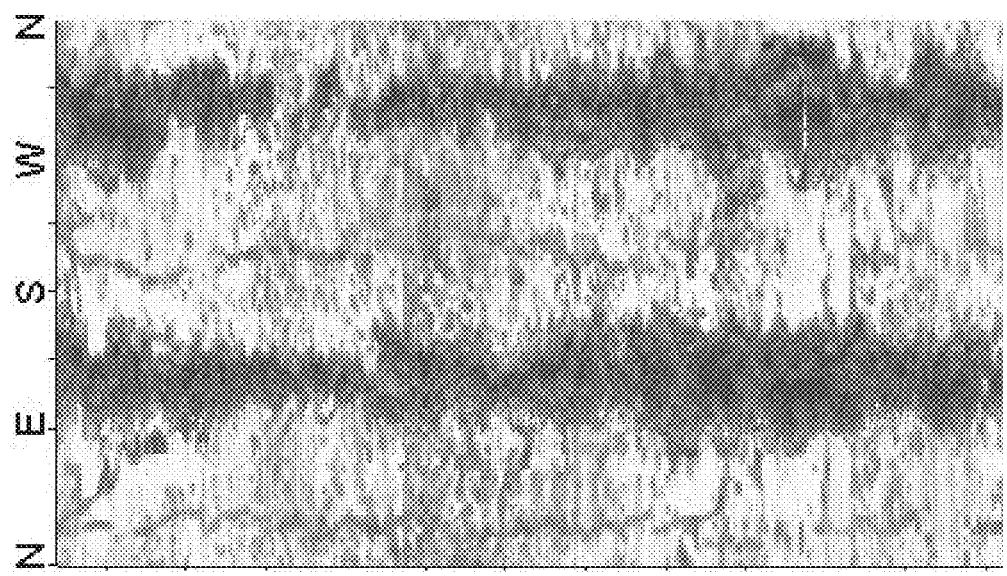
FIG. 4 shows an image of a vertical segment of the well in which the width of the damage has been measured according to the vertical height. Regions with damage are darker.

FIG. 4 shows an image of the perforated wall in a well, showing the areas where damage has occurred. The letters N, E, S and W identify North, East, South and West, respectively, and correspond to a perimetral development of 360 degrees ($2\pi$ radians).

The image is taken a posteriori, once the well has been drilled or obtained by sensing during drilling. The dark spots are areas of damage in the wall based on which it is possible to determine the width of damage at a given vertical height z but they do not allow establishing the depth in the wall or providing the determination thereof before drilling is performed.

Figure 5:
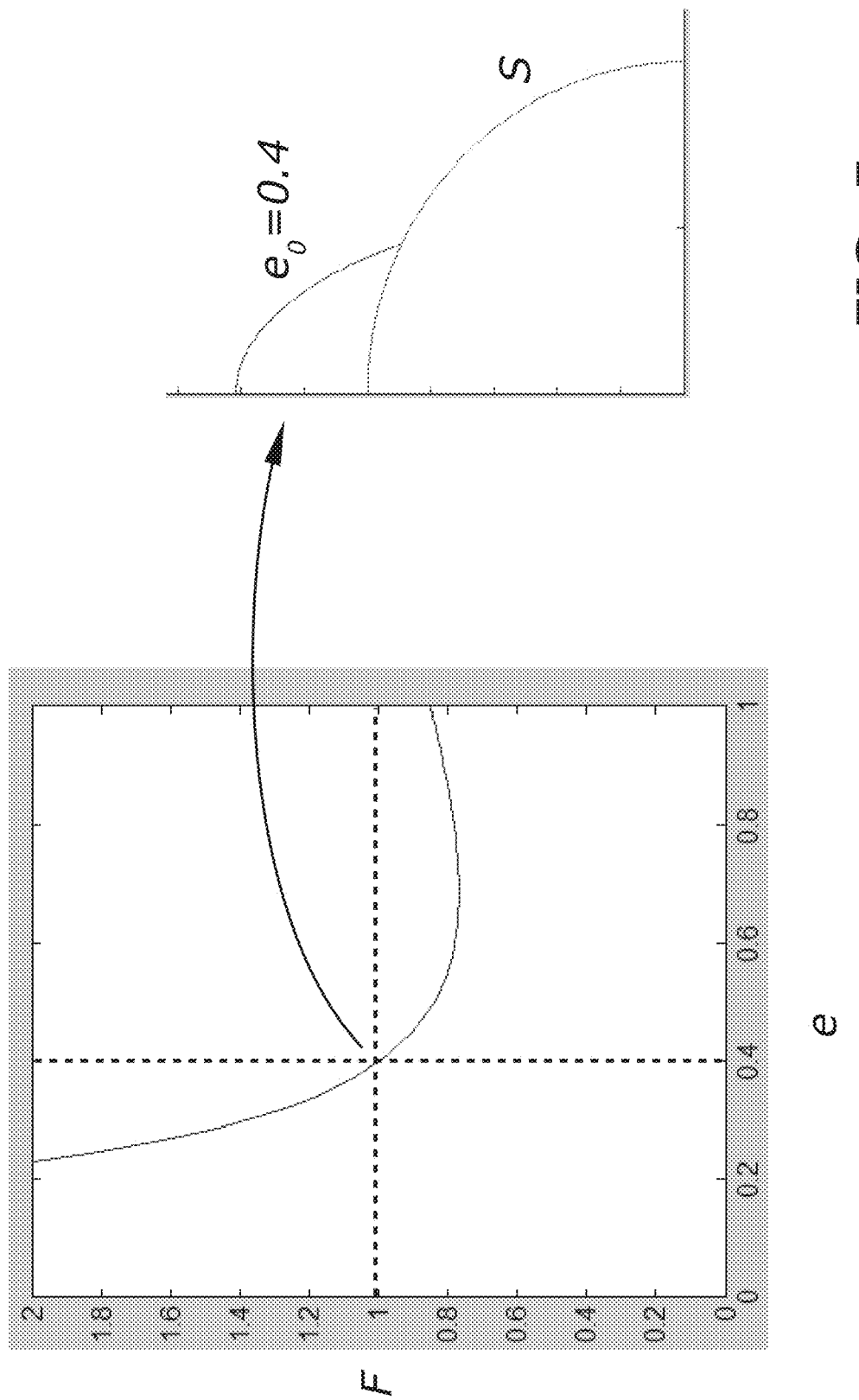
FIG. 5 shows two graphs related to one another. The graph on the left shows a drawing with the factor of safety F according to the eccentricity e with a value of one to consider the factor of equilibrium between the external forces and resistance forces. After having determined the eccentricity, the graph on the right shows the ellipse with said eccentricity determining the transverse area of the damage.

FIG. 5 shows a graph of the function $F(\theta_0,e)=f_0=1$ with eccentricity e as a free parameter. It is where the function takes this value $f_0=1$, i.e., the value which determines the eccentricity e which in turn defines a single ellipse of the family of ellipses defined above.

In this embodiment, the ellipse has an eccentricity of 0.4. The right side of the drawing shows a quarter of a circumference, the circumference representing the section of the wall of the well, and also a quarter of the ellipse having an eccentricity of 0.4. The inner area of the ellipse having an eccentricity of 0.4 is established as the region of damage.

Given this region of damage, it is possible to repeat the method for a plurality of sections S distributed along the wellbore path. By means of interpolating the sections of damage along a segment of the wellbore path, it is possible to determine the collapse volume in that segment before drilling is performed.

With the collapse volume, it is possible to establish drilling fluid injection parameters which allow discharging the collapse volume. Otherwise, the method allows recalculating the collapse volume by changing the pressure conditions established by the drilling fluid. For example, if the density γ of the drilling fluid increases, pressure on the walls of the well increases and compensates for the stresses exerted by the eliminated rock on the drilling and giving rise to the free surface, given that they now no longer perform a structural function. The region of damage is thereby reduced given that the pressure forces against the wall exert this compensating force.

This force has a limit since an excessive increase in the density of the drilling fluid can cause a pressure that is too high to be withstood by the wall of the well, generating cracks.

Therefore, this embodiment shows how the region of damage depends on the parameters used in the calculation of the stress state at the point where the plane of section S has been plotted out, and particularly on the pressure of the drilling fluid.

It is possible to simulate different conditions of damage for a plurality of densities of the drilling fluid and establish those that give rise to a collapse volume less than the acceptable limit by the means installed in the well.

One application of the method of determining damage, according to an embodiment is to establish a drilling method.

Figure 6:
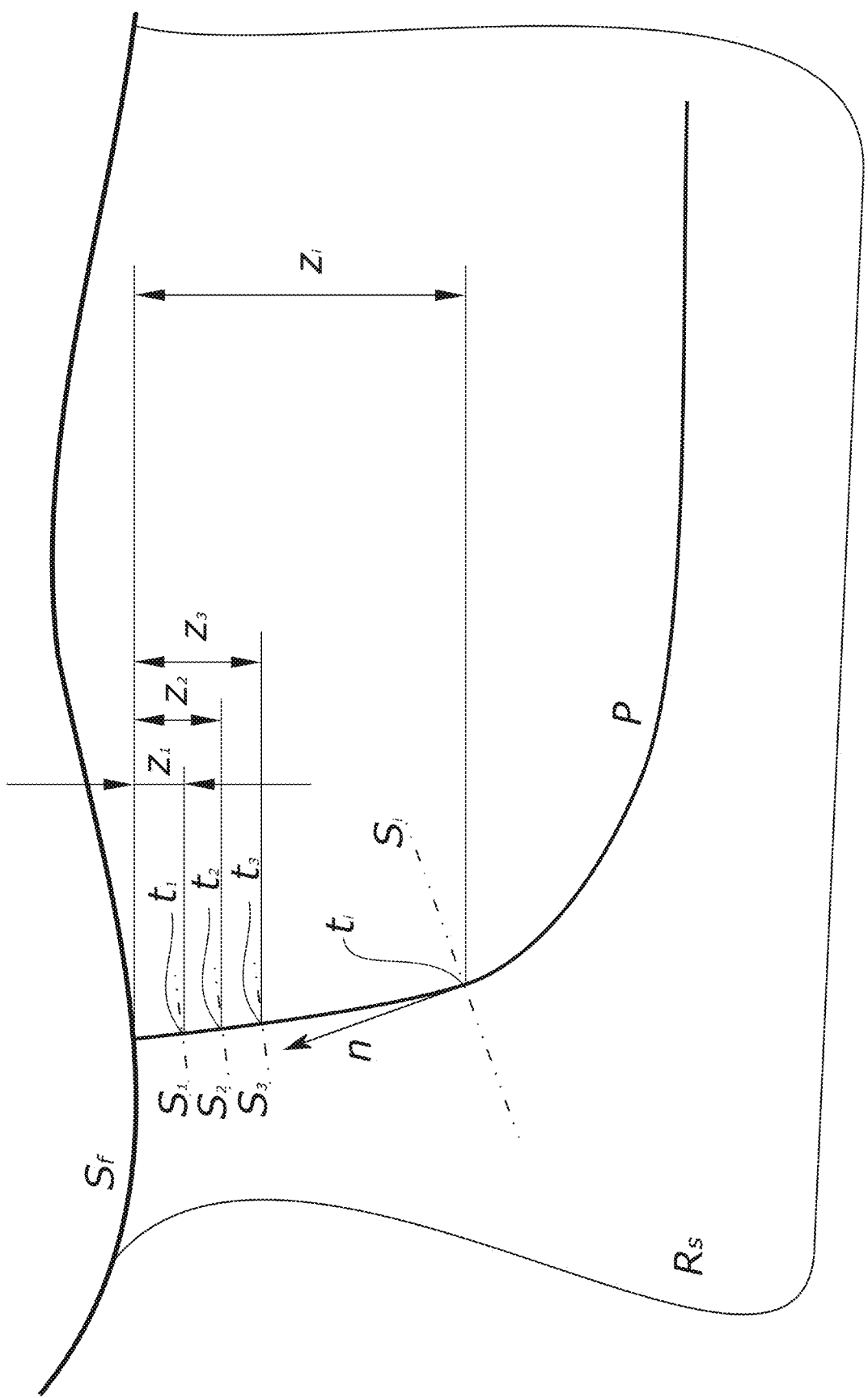
FIG. 6 partially reproduces FIG. 1 as an embodiment where the determination of damage is performed in a discrete set of the drilling path for subsequently evaluating the collapse volume, and therefore for performing drilling according to the parameters estimated according to an embodiment.

In this method, as shown in FIG. 6, a discretization $t_i=1 \ldots N$ of the coordinate (t) along the wellbore path is established. If the wellbore is vertical, the parameter t coincides with the vertical coordinate z.

Once having established the well-drilling diameter D and a wellbore path through the geomechanical model and of the fluid flow model of the reservoir, the transverse section $S_i$ of diameter D is determined for each $t_i$, and in said section $S_i$, for a plurality of values of density of the drilling fluid $\gamma_j^l, j=1 \ldots M$, the following steps are carried out:

i. determining the pore pressure $p_p$, maximum stress $\sigma_{max}$, minimum stress $\sigma_{min}$ and the mechanical properties of the rock;

ii. determining the stress state of the rock in said section $S_i$ at least according to the data from the preceding step;

iii. determining in section $S_i$ the region $R_j^i(\gamma_j^l, S_i)$ of damage according to the method already described and the value of the area $A_j^i(\gamma_j^l, S_i) = \|R_j^i(\gamma_j^l, S_i)\|$ said region $R_j^i(\gamma_j^l, S_i)$;

Then for each coordinate (t) of the discretization $t_i=1 \ldots N$:

iv. a correspondence $V^i(\gamma_j^l)$ between the discrete values of density of the drilling fluid $\gamma_j^l, j=1 \ldots M$ and the value of the area $A_j^i(\gamma_j^l, S_i)$ is determined, the latter being interpreted as the detachment volume (V) of the wall of the well per unit of drilled length;

v. a combination of drilling speed (v), density ($\gamma$) of the injected drilling fluid and flow rate (Q) thereof, such that it establishes a volume of material $V_e(v,\gamma,Q)$ to be discharged, material being cut by the bit plus the collapse material $V^i(\gamma_j^l)$, less than that determined by the drilling system, so as to allow removing the volume of material from the well without a drilling bit collapsing.

After having determined the drilling parameters, the well is drilled according to the values of drilling speed (v), density ($\gamma$) of the injected drilling fluid and flow rate (Q) thereof for each coordinate of the drilling path.

The drilling operation discharges the sum of two volumes of material, the material being cut by the bit plus the material being collapsed near the bit because the damaged area corresponds to material showing a stress greater than the allowable stress of the rock in that location and then it further collapses. The sum of the two volumes is discharged by the injected drilling fluid.

The material being cut by the bit is determined by the drilling speed (v) and the section of well being drilled.

An skilled person on drilling systems, according to his practice, determines the maximum volume of material to be discharged by the drilling system taking into account at least the density ($\gamma$) of the injected drilling fluid and flow rate (Q)) this is, he knows how much material can be removed by the drilling system under such drilling conditions, specifically those related to the drilling fluid being injected. It is to be noted that, apart from the variables related to the drilling fluid to be injected, the skilled person, according to his practice, may use further variables related to the drilling system per se such as the piping dimensions or pump characteristics, in order to tune-up the maximum volume of material to be discharged by the drilling system.

The invention provides the correspondence $V^i(\gamma_j^l)$, the volume being detached when drilling, to the skilled person and therefore solves the problem of determining accurately the volume of material to be discharged. This material to be discharged is less than that determined by the drilling system. The rest of the feature is just a clarification indicating that the result of using the combination of parameters (drilling speed (v), density ($\gamma$) of the injected drilling fluid and flow rate (Q) fulfilling the specified condition allows removing the volume of material from the well without a drilling bit collapsing.

According to the invention, the skilled person can determine the drilling speed (v), the density ($\gamma$) of the injected drilling fluid and flow rate (Q) for each coordinate of the well path as for each density ($\gamma$) he knows the volume of the collapsing material $V^i(\gamma_j^l)$.

A second application of the method according to the invention is the estimation of the depth of the damage in the wall of the well (known as caliper). Given that, by hypothesis, the configuration of the region of the damage has been determined as elliptical, the value of b−R, i.e., the difference between the semi-major side of the ellipse and the radius of the wall of the well, is taken as an estimated value of the depth of the damage.

The invention claimed is:

1. A method of estimating a region of damage in a domain of a reservoir due to collapse in a wall of a borehole of a well during a drilling operation, the method comprising the steps of:

a) generating a geomechanical model of the domain comprising a drilling path of the well by at least incorporating data and mechanical properties of rock in the domain of the reservoir for a pre-specified in situ stress field;

b) generating a fluid flow model of the same domain at least incorporating data relating to a drilling fluid, where said fluid flow model models rock in the reservoir as a porous medium and comprises a pore pressure in said porous medium;

c) establishing a vertical height z of a circular section S of the well in the region of damage being estimated, section S being transverse to the drilling path of the well, and establishing an orientation of the normal with respect to section S;

d) determining a pressure of the drilling fluid, pore pressure $p_p$, maximum stress $\sigma_{max}$, minimum stress $\sigma_{min}$ and the mechanical properties of the rock in the section based on the geomechanical model;

e) determining a stress state $\sigma(\theta)$ of the rock on a periphery of section S of the borehole at least according to the data from the preceding step, where:
   i. $\sigma$ is a scalar value of an equivalent stress,
   ii. $\theta$ is an angle with respect to a system of axes located and centered in section S of the S borehole with an orientation on a plane containing section S, such that $\sigma(\theta=0)=\sigma_{min}$ and $\sigma(\theta=\pi/2)=\sigma_{max}$;

f) determining a collapse angle $\theta_{br}$ as the angle centered in $\theta=\pi/2$ and covering an arc of the periphery of section S where the stress state $\sigma(\theta)$ is greater than an allowable stress of the rock;

g) defining a family of ellipses of eccentricity e contained on the plane containing section S, wherein eccentricity e for any given ellipse is defined as a ratio of the semi-minor side to the semi-major side of the ellipse, such that:
   i. the ellipse corresponding to the value of eccentricity e=1 is a circumference established by the circular section S of the well; and
   ii. an intersection between another ellipse and said circular section S of the well is established at least at points $\pi/2+\theta_{br}/2$ and $\pi/2-\theta_{br}/2$ as well as at the symmetrical points $-\pi/2+\theta_{br}/2$ and $-\pi/2-\theta_{br}/2$, respectively;

h) defining a factor of safety $$F = \Sigma\sigma_{ext}/\Sigma\sigma_{res}$$

where $\Sigma\sigma_{ext}$ is the sum of external forces on the rock at a given point of the rock, depending at least on in situ stresses, the density ($\gamma$) of the drilling fluid, the elastic properties of the rock, and the pore pressure $p_p$; and where $\Sigma\sigma_{res}$ is the sum of resistance forces of the rock at the same point, depending on a stress tensor, resistance properties of the rock, and an angle of internal friction of the rock;

i) determining a function $F(\theta, e)$ as a factor of safety F evaluated at a point of the ellipse defined by the eccentricity e for a value of the angle $\theta$;

j) establishing a cut-off threshold value $\theta_0 < \pi/2$;

k) determining the value of eccentricity $e_0$ closest to one verifying $F(\theta_0, e_0) = f_0$, where $f_0$ is a pre-established reference value close to one;

l) establishing an intersection region between the ellipse of eccentricity $e_0$ and a circumference of section S of the well as the region of damage, according to section S of the well and at vertical height z.

2. The method according to claim 1, wherein an estimation of a depth of damage $b_d$ in the wall is calculated as a difference between the semi-major side b of the ellipse of eccentricity $e_0$ and a radius of the circumference of section S of the well.

3. The method according to claim 1, wherein an estimation of a width angle of damage in the wall is calculated as an angle covering the intersection points between the ellipse of eccentricity $e_0$ and the circumference of the section of the well.

4. A well-drilling method using a drilling bit for drilling a well of a well-drilling diameter D at a drilling speed (v) and, injecting a drilling fluid with a density ($\gamma$) and flow rate (Q) during the drilling process, for injection or production of a gas or oil reservoir, the method comprising the steps of:

1. carrying out steps a) and b) of claim 1;
2. establishing the well-drilling diameter D and the drilling path through the geomechanical model and the fluid flow model of the reservoir;
3. establishing a discretization $t_i = 1 \ldots N$ of a coordinate (t) along the drilling path;
4. determining, for each $t_i$, a transverse section $S_i$ of diameter D, and in said section $S_i$, for a plurality of values of density of the drilling fluid $\gamma_j^l, j=1 \ldots M$, determining in section $S_i$ the region $R_j^i(\gamma_j^l, S_i)$ of damage according to claim 1, and a value of the area $A_j^i(\gamma_j^l, S_i) = \|R_j^i(\gamma_j^l, S_i)\|$ said region $R_j^i(\gamma_j^l, S_i)$;
5. establishing, for each coordinate (t) of the discretization $t_i = 1 \ldots N$:

a correspondence $V^i(\gamma_j^l)$ between the discrete values of density of the drilling fluid $\gamma_j^l, j=1 \ldots M$ and the value of the area $A_j^i(\gamma_j^l, S_i)$ of the region $R_j^i(\gamma_j^l, S_i)$, the latter being interpreted as a detachment volume (V) of the wall of the well per unit of drilled length;

a combination of drilling speed (v), density ($\gamma$) of the injected drilling fluid and flow rate (Q) thereof, such that a volume of material $V_e(v,\gamma,Q)$ to be discharged is established, material being cut by the drilling bit plus a collapse material $V^i(\gamma_j^l)$, less than that determined by a drilling system, so as to allow removing the volume of material from the well without a drilling bit collapsing; and 6. for each coordinate of the drilling path, drilling the well according to the drilling speed (v), density ($\gamma$) of the injected drilling fluid, and flow rate (Q).

5. A computer program product stored on a non-transitory computer-readable medium and comprising computer-implementable instructions, which, when executed by a computer, cause the computer to carry out the method according to claim 1.

\* \* \* \* \*